United States Patent
Kaufmann et al.

(10) Patent No.: US 7,005,739 B2
(45) Date of Patent: Feb. 28, 2006

(54) HIGH POWER SEMICONDUCTOR MODULE

(75) Inventors: Stefan Kaufmann, Aarau (CH);
Thomas Lang, Bubikon (CH); Egon Herr, Zürich (CH); Mauro Nicola, Lenzburg (CH); Soto Gekenidis, Gränichen (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 10/479,220

(22) PCT Filed: May 30, 2002

(86) PCT No.: PCT/CH02/00283

§ 371 (c)(1),
(2), (4) Date: Jun. 10, 2004

(87) PCT Pub. No.: WO02/097883

PCT Pub. Date: Dec. 5, 2002

(65) Prior Publication Data
US 2004/0207070 A1  Oct. 21, 2004

(30) Foreign Application Priority Data
Jun. 1, 2001  (EP) .................................. 01810539

(51) Int. Cl.
*H01L 23/34* (2006.01)
(52) U.S. Cl. .............. 257/719; 257/690; 257/704; 257/710; 257/718; 257/726; 257/727; 257/785

(58) Field of Classification Search ................ 257/146, 257/150, 177, 181, 690, 704, 710, 718, 719, 257/726, 727, 772, 779, 785
See application file for complete search history.

(56) References Cited

U.S. PATENT DOCUMENTS

| | | | |
|---|---|---|---|
| 3,515,955 A | | 6/1970 | Butenschon |
| 4,646,131 A | * | 2/1987 | Amagasa et al. ........... 257/785 |
| 5,016,088 A | * | 5/1991 | Ermilov et al. ............. 257/726 |
| 5,705,853 A | * | 1/1998 | Faller et al. ................. 257/719 |

FOREIGN PATENT DOCUMENTS

| | | | |
|---|---|---|---|
| DE | 27 31 211 | | 1/1979 |
| DE | 3508456 A1 | * | 9/1986 |
| EP | 0 989 611 | | 3/2000 |

* cited by examiner

*Primary Examiner*—Andy Huynh
(74) *Attorney, Agent, or Firm*—Buchanan Ingersoll PC

(57) ABSTRACT

The stackable power semiconductor module comprises electrically conductive base plates, an electrically conductive cover plate and a plurality of semiconductor chips. The semiconductor chips are arranged in groups of several on separate base plates in preassembled submodules. The base plates are moveable towards the cover plate. The submodules are paralleled inside the module housing. The submodules are fully testable according to their current ratings. Altering the number of submodules paralleled inside the housing can vary the overall current rating of a module.

9 Claims, 4 Drawing Sheets

HIGH POWER SEMICONDUCTOR MODULE

This application is a 371 of PCT/CH02/00283 filed May 30, 2002.

FIELD OF THE INVENTION

The invention relates to the field of high power semiconductors.

It relates to a power semiconductor module as described in the preamble of claim 1.

BACKGROUND OF THE INVENTION

Integrated Gate Bipolar Transistor (IGBT) technology reached new highs with its deployment in voltage source converters (VSC) for power system applications such as HVDC transmission and power quality management.

Today, the IGBT is the preferred choice for such applications because of the following features:

Low-power control, since it is a MOS-controlled device, e.g. advantageous when operating at very high voltage levels (several 100 kV)

Transistor action, which allows precise controlling of the device in a manner that is not possible with latching alternatives (for instance, the converter can be turned off even in short circuit conditions)

High switching speed, thus making high switching frequency feasible

While well suited electrically, the IGBT did not reach its current status in such high power, high profile applications until a new press pack technology was introduced. Some of the key packaging aspects were redesigned thus allowing to advance from traditional thyristor-based line-commutated converter technology to IGBT-based voltage-source technology.

The competing IGBT press pack packages available today are adapted from traditional thyristor ‚hockey puck' packages. This rigid pressure contact technology is not optimized to protect sensitive microstructures on the surface of IGBT chips. As a consequence users are required to provide near-perfect cooler surfaces and handle such devices with a great deal of care during assembly. The issue is further aggravated when the module size is increased for higher current ratings. There is a significant cost impact on system production cost as a result of these shortcomings.

Converters ranging in power from a few to several hundreds of MW utilize considerable numbers of semiconductor devices. As converter voltages reach tens of hundreds of kV, series connection of a large number of semiconductor devices is essential. Most suited for series connection is the stacking of devices on top of each other, well known from thyristors. An IGBT module suited for such an application has to fulfill the following mechanical requirements:

In order to provide a satisfactory mechanical stability during transport and operation of an assembled stack, which can be several meters long, a high clamping force of up to 100 kN is mandatory.

To minimize system and assembly cost, high tolerance to pressure non-uniformity is required.

A new pressure-contact technology was introduced in U.S. Pat. No. 5,705,853. The direct pressure on the chip is decoupled from the external clamping force by using a flexible emitter contact (individual press-pin) in combination with a stiff housing as shown schematically in FIG. 1.

The contact partners (individual press pins) 6 on the chips 1 are flexible and upon clamping, they are compressed until top plate 3 and base plate 2 touch the stiff housing elements 4. When the external force is further increased the pressure on the chips 1 will remain stable, whereas the housing 4 will take the additional force. Top plate 3 has to be thick enough to allow vertical movement of the rod that guides the flexible press pin contact elements and not to bend under the pressure applied by these contact elements 6. The individual press pins 6 allow a homogenous pressure distribution even if a large number of chips are arranged inside one module.

The significant advantage of this concept is that it is much less sensitive to pressure inhomogenities compared to traditional ‚hockey-puck' designs with stiff copper polepieces and that it allows very high mounting force as well as much wider mechanical tolerances. This results in an increased mechanical reliability at reduced costs.

In HVDC systems operating at high line voltages, numerous devices are normally connected in series. One large VSC based HVDC station, which handles several hundred MW is likely equipped with more than thousand IGBT modules in total. By adding extra devices in the stack of series connected devices, redundancy can be built into the system. This enables operating the system even if some of the individual semiconductor devices fail, securing a high availability of the system and minimizing the need for periodic maintenance.

Since the devices are operated in series connection, it is a prerequisite for such redundancy that the devices fail in a controlled manner, forming a short circuit with sufficiently low resistance to be able to conduct the total current in the system. The devices are not allowed to fail open circuited and thereby cause disruption of the load current. The failed components, working in the Short Circuit Failure Mode (SCFM) are replaced later during scheduled maintenance.

In order to increase SCFM-reliability a new packaging technology has been developed. EP 0 989 611 describes a semiconductor module with long-term stable SCFM, even at low currents. The silicon of the semiconductor chip is metallurgically alloyed with an optimized contact partner. A low melting compound is formed leading to a highly conductive path through the chip. The alloying of the chip occurs immediately after the failure, when a high current strike causes the metallurgically optimized material, which is pressed onto the chip, to melt and react with the underlying silicon. The result is a reliable SCFM performance during ‚after-life' operation in the system.

It would be economically advantageous to standardize stack design for converters of various current ratings. It is therefore preferred that the overall package is fixed for a range of IGBT current ratings, without significant increase in the cost of devices with lower current ratings.

DESCRIPTION OF THE INVENTION

It is therefore an object of the invention to create an improved power semiconductor module of the type mentioned initially, which allows a high degree of standardization and provides flexibility over a range of current ratings.

These objects are achieved by a power semiconductor module according to claim 1.

In the inventive power semiconductor module with electrically conductive base plates, an electrically conductive cover plate and a plurality of semiconductor chips, the semiconductor chips are arranged in groups of several on separate base plates in preassembled submodules, and these base plates are moveable towards the cover plate.

The submodules are paralleled inside the module housing. The submodules are fully testable according to their current ratings. Testing of a submodule is more reliable than testing of single chips, because interaction of several, e.g. different kinds of chips can be tested. Overall current rating of a module is determined by the number of submodules paralleled inside the module housing.

In a preferred embodiment of the invention, contact elements that connect the semiconductor chips with the cover and/or base plate are guided by submodule housing elements, which are attached to the base plate. These submodule housing elements stabilize the semiconductor chips and the contact elements of preassembled submodules during handling and transport.

The submodule housing elements, which at least partially surround the base plate of each submodule, have outside protrusions that interact with protrusions of the housing elements of the module. Before mounting the module onto a cooling plate, or stacking several modules on top of each other, each submodule is clamped into the module housing with the movable base plates sticking out of the module housing elements. After mounting or stacking the base plates are aligned with the housing elements. The housing elements take the external stacking force while the pressure applied by the contact elements on the base plate is stable.

The most desirable aspect of modular design is its cost effectiveness. This is principally achieved by significantly higher production yields, particularly for modules with large current ratings, using this approach compared to these using non-modular approaches. Small submodules can be produced in high volumes at high yields. Whole module yields are near perfect as submodules are fully pretested and in the event of some failing in final test, the faulty submodule is simply lifted from the housing and replaced.

BRIEF DESCRIPTION OF THE DRAWINGS

The subject matter of the invention will be explained in more detail in the following text with reference to preferred exemplary embodiments which are illustrated in the attached drawings, in which.

The reference symbols used in the drawings, and their meanings, are listed in summary form in the list of reference symbols. In principle, identical parts are provided with the same reference symbols in the figures.

DETAILED DESCRIPTION OF PREFERRED EMBODIMENTS

Figure 1:
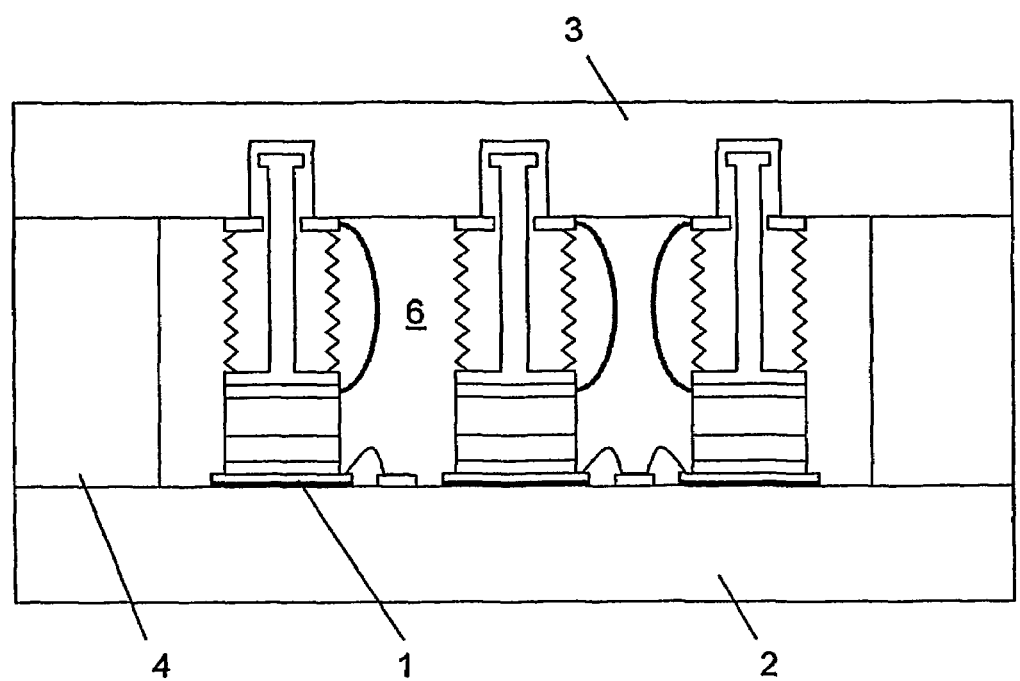
FIG. 1 shows a semiconductor module of prior art.
Figure 2:
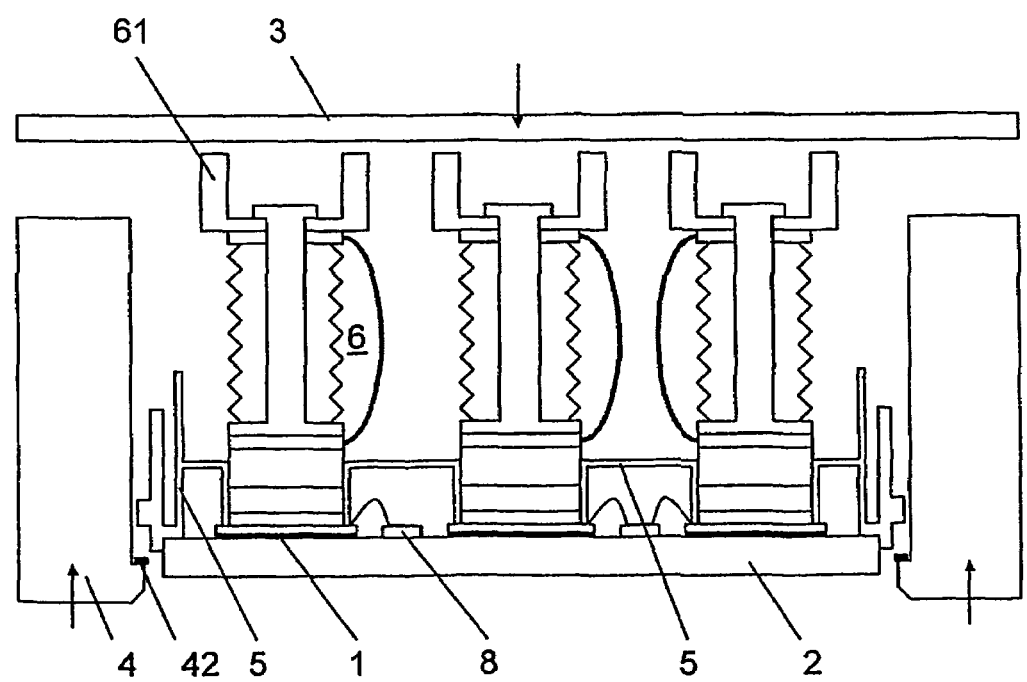
FIG. 2 shows parts of the semiconductor module of the invention with a submodule, prior to clamping the submodule into the module.

FIG. 2 shows one of several submodules of a semiconductor module according to the invention.

The desired number of semiconductor chips 1, e.g. IGBTs or diodes, are soldered to a base plate 2 with a low coefficient of thermal expansion (e.g. made of Mo) such that reliable solder bonds between the chips and the base plate are formed. The semiconductor chips 1 are provided with first electrodes on the bottom and second electrodes on the top surface.

The kind and number of semiconductor chips can be chosen without any restrictions. It is possible to build submodules with contain only IGBTs, only diodes, or any possible IGBT to diode ratio.

On top of the chips 1 flexible individual press pin contacts 6 are arranged together with several different layers for an optimal SCFM. Since these layers are not soldered but pressed together (dry press contacts) they are guided by molded polyamide submodule housing elements 5 which are attached, e.g. glued onto the base plate 2. The submodule housing elements make sure the several layers on top of the chips can not be shifted.

Spring washers apply pressure onto the contact stack and the semiconductor chip. On top of the flexible individual press pin contacts is a contact element 61 for contacting the cover plate 3 of the module. The contact element 61 is the electrical connection between the individual press pin 6 and the cover plate. It is thick enough to carry the current flowing through the semiconductor chip. The contact element 61, is U-shaped with a hole at the bottom through which the rod that guides the spring washers is disposed. The contact element 61 is high enough to allow vertical movement relative to the rod. Compared to conventional modules, the thickness of the cover plate can be reduced, because the vertically movable rod is fully embedded in the contact element 61. The cover plate 3 is solely used for fixing the press pin stacks so that they will not fall out of the submodules during handling and transport. Compared to conventional modules, less material is being used for the cover plate which of course helps to reduce costs.

The gate electrodes of the IGBTs are connected to gate runners 8 via wire-bond contacts. Silicon gel is potted into the submodule housing to provide passivation and protection of the semiconductor chip arrangements. The silicon gel also prevents shifting of the several layers on top of the chip. After curing of the silicon gel, a fully functioning and testable submodule is available.

The finished submodules are then fully tested according to the kinds and numbers of semiconductor chips mounted thereon.

After being tested the submodule is clamped into the module housing, consisting of a conductive cover plate 3 and of stiff module housing elements 4.

The module housing has a fixed number of slots for submodules, e.g. six slots in two rows. Within that fixed number any number of submodules can be inserted into the module housing, e.g. depending on the desired current rating.

The module housing is resilient to explosions. Experiments have shown that materials with a minimum impact strength of 60 kJ/m$^2$ are needed. The stiff housing elements 4 are made of composite materials reinforced with long fibers, with a minimum length of the reinforcing fibers of around 0.1 m. These materials have that kind of impact strength and therefore provide the needed strength to make the housing survive stresses like a current discharge of hundreds of kA for durations of hundreds of mikroseconds leading to an explosive pressure. Other commonly used short fiber reinforced plastic materials would not be sufficient.

Figure 3:
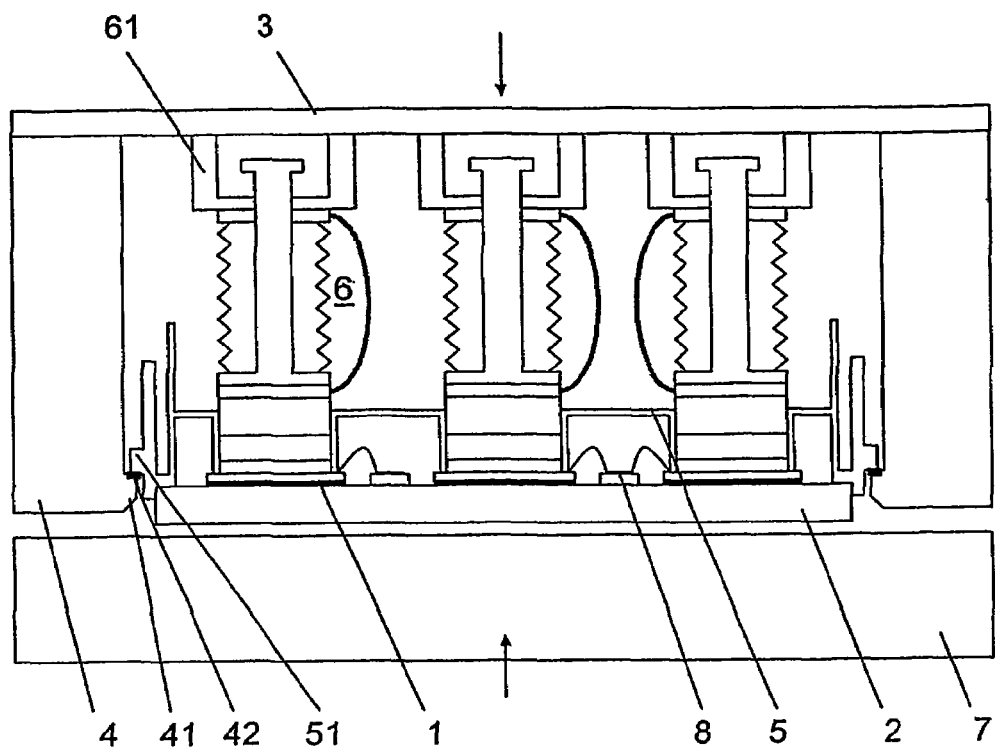
FIG. 3 shows the submodule of FIG. 2 clamped into the module, prior to mounting the module onto a cooling plate.

As shown in FIG. 3 the submodules are clamped inside the module housing. The submodule is being pressed slightly against cover plate 3 while outside protrusions 51 of the submodule are being pressed slightly against protrusions 41 of the stiff module housing elements. Between interacting protrusions 41 and 51, small pieces of elastic, insulated foam 42 are disposed to absorb shocks and prevent damage to the submodules during handling and transport. The foam material is glued onto the protrusions 41 of the stiff module housing. Base plate 2 is sticking out of the bottom opening of the module housing. The top contact elements 61 of the contact stacks are being slightly pressed against the cover plate 3 and the flexible contact elements 6 are being compressed, applying a small contact force onto the semiconductor chips 1.

Each finished module with the submodules clamped inside is then mounted onto a cooling plate 7. Modules with cooling plates are then stacked (series connected).

Figure 4:
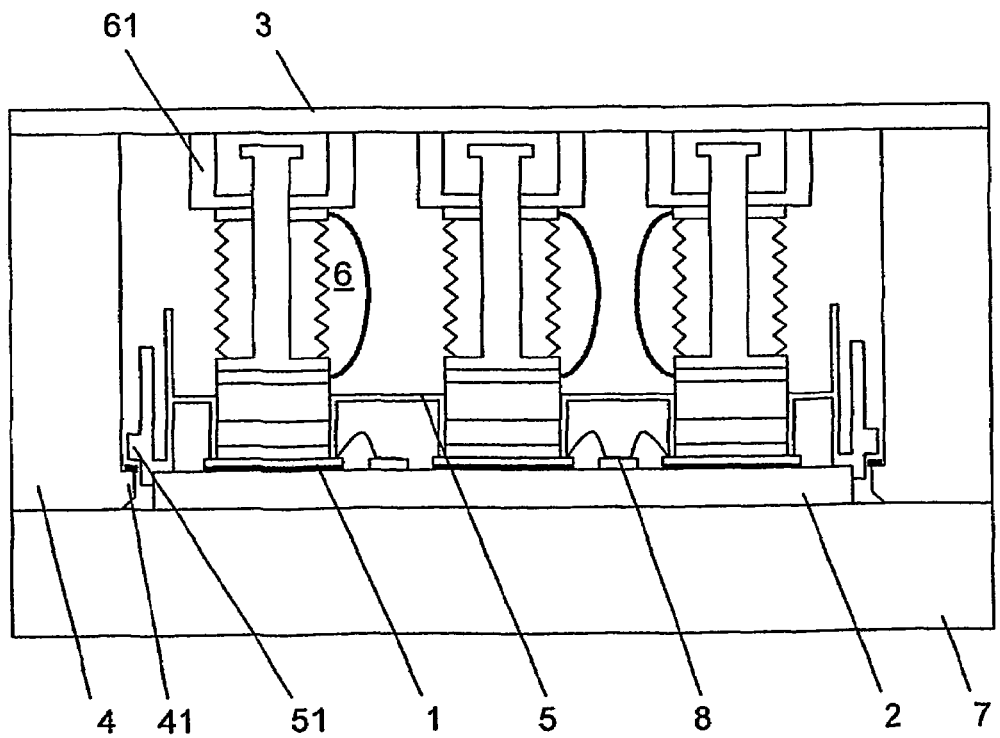
FIG. 4 shows the submodule of FIG. 3, with the module being attached to a cooling plate.

As shown in FIG. 4 the protrusions 41 and 51 are no longer interacting. The base plate 2 is pushed back into the module housing, aligned with the stiff housing elements 4. The flexible contact elements 6 are being further compressed, applying a further increased, optimal contact force onto the semiconductor chips 1.

Since the full contact force of the individual press pin is applied only when the module is mounted on the cooling plate and stacked together with other modules, top plate 3 can be kept thin. During assembly and storage of the module, only a small contact force is applied onto the top plate 3, so that it will not bend.

Figure 7:
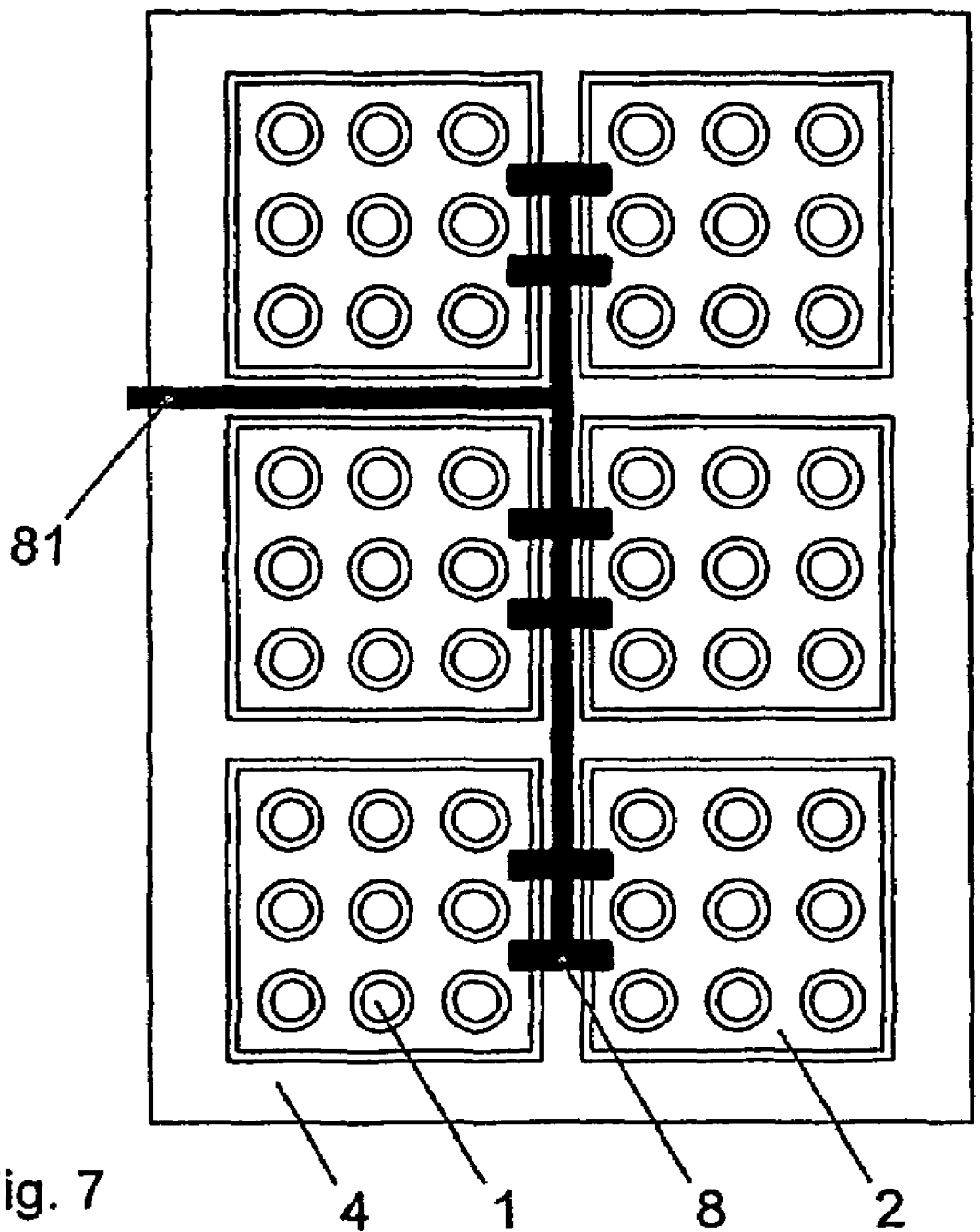
FIG. 7 shows a top view of the semiconductor module of FIG. 2.

Semiconductor control signals, e.g. gate signals for IGBTs, are provided through a common gate/auxiliary contact 81 mounted on the cover of the module which is shown in FIG. 7. Gate runners of each submodule are conntacted via a spring electrical contact (not shown) and collected on a common gate signal conductor 8.

Figure 5:
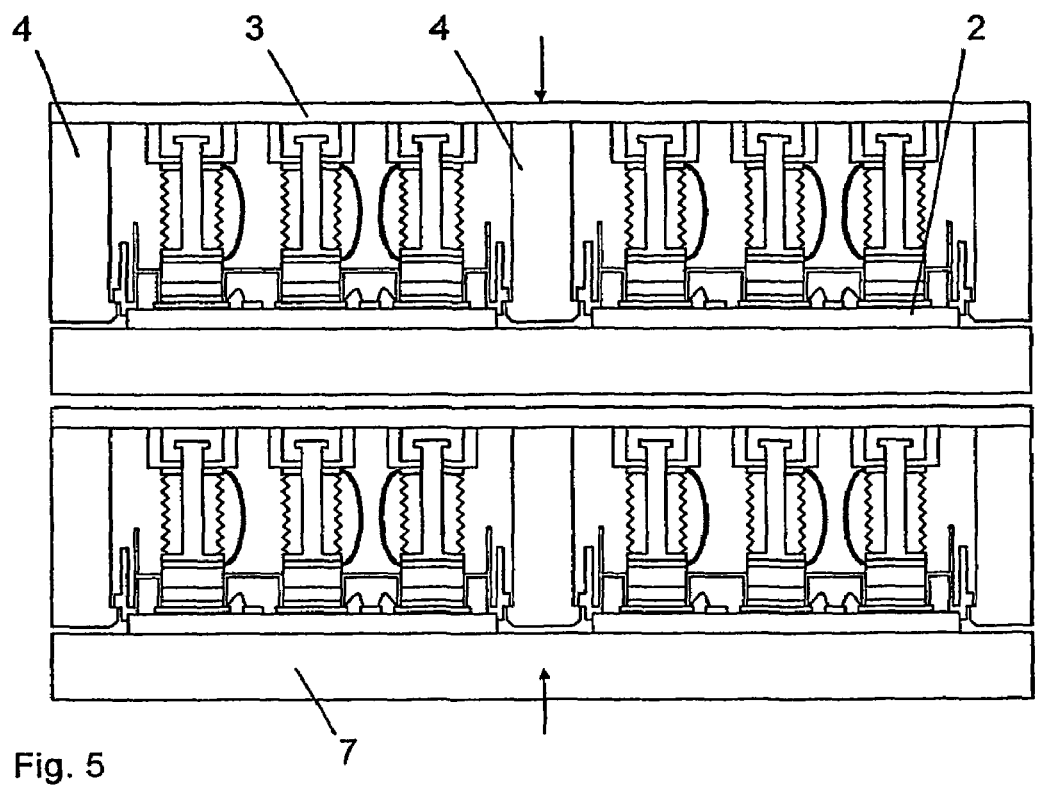
FIG. 5 shows a stack of the semiconductor modules of FIG. 2 prior to applying external clamping force.
Figure 6:
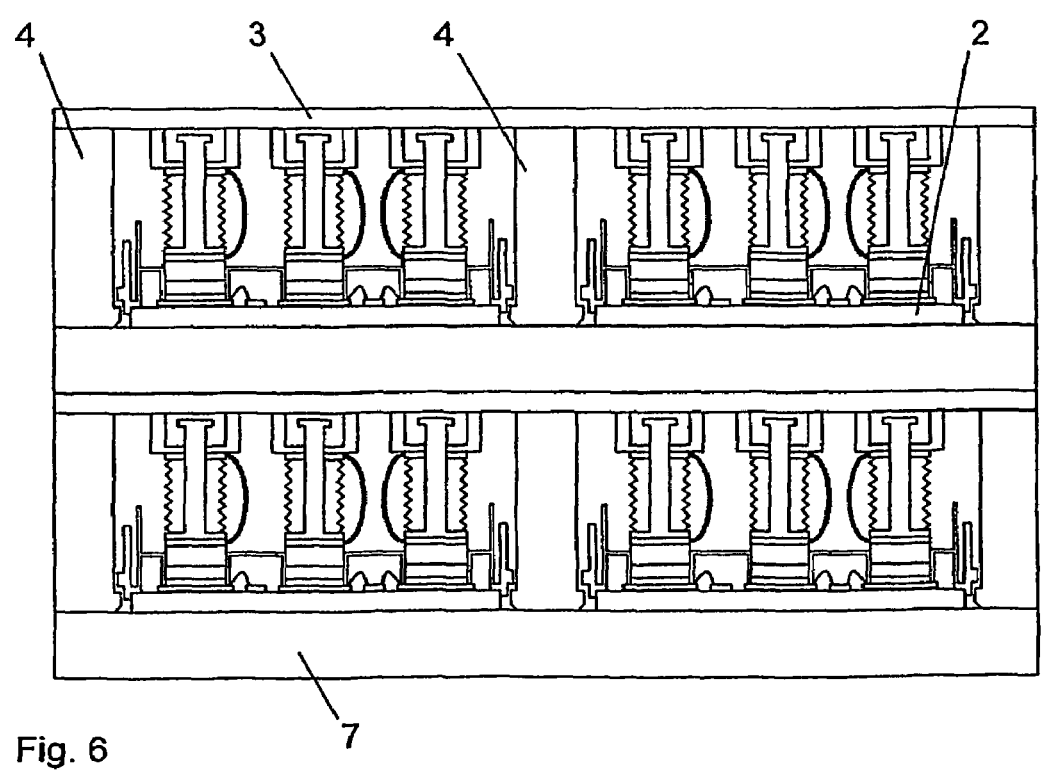
FIG. 6 shows the compressed stack of semiconductor modules of FIG. 5.

As shown in FIGS. 5 and 6 several pretested submodules are paralleled inside one module housing. The number of submodules can be chosen depending on the desired current rating of the module. FIG. 5 shows two decompressed modules prior to stacking and applying clamping force.

FIG. 6 shows a finished stack of two semiconductor modules according to the invention.

Thanks to an advantageous aspect ratio (heigh/width≈1/10) of the modules, the stack is very stable. The clamping force of up to 100 kN is easily taken by the stiff housing elements 4 of each module in the stack, while the pressure on the semiconductor chips remains stable.

Thanks to the semi-free floating construction very low thermal resistance is achieved which enables single-side cooling of each module in a stack.

Excellent paralleling of submodules is achieved due to the symmetrical nature of construction for the module and by proper routing of gate signals as shown in FIG. 7.

What is claimed is:

1. Power semiconductor module comprising at least one electrically conductive base plate, an electrically conductive cover plate, stiff module housing elements and a plurality of semiconductor chips, said semiconductor chips being electrically connected by means of first main electrodes to the at least one base plate, said semiconductor chips being electrically connected by means of second main electrodes and via flexible, compressible contact elements to the cover plate, said cover plate being attached to said stiff module housing elements, forming a module housing, said stiff module housing elements limiting the compression of the flexible contact elements, wherein the power semiconductor module comprises at least one preassembled and fully testable submodule with a base plate and a group of several of said semiconductor chips, said semiconductor chips being arranged on said base plate of said submodule, said at least one base plate of the at least one submodule is moveable towards the cover plate.

2. Power semiconductor module of claim 1, wherein contact elements of semiconductor chips of the at least one submodule are guided by submodule housing elements, said submodule housing elements being attached to the base plate.

3. Power semiconductor module of claim 2, wherein the submodule housing elements are at least partially surrounding the base plate and have outside protrusions, and wherein the at least one submodule is clamped into the module housing by said protrusions of the submodule housing elements being carried by protrusions of the stiff housing elements.

4. Power semiconductor module of claim 1, wherein the stiff module housing elements are made of a material with an impact strength greater than 60 kJ/m$^2$.

5. Power semiconductor module of claim 4, wherein the stiff module housing elements are made of composite material reinforced with long fibers.

6. Power semiconductor module of claim 1, wherein each submodule comprises at least one flexible, compressible contact element.

7. Power semiconductor module of claim 2, wherein each submodule comprises at least one flexible, compressible contact element.

8. Power semiconductor module of claim 1, comprising submodule housing elements arranged between the chips to fix the positions of the chips relative to each other.

9. Power semiconductor module of claim 2, wherein the submodule housing elements are arranged between the chips and fix the positions of the chips relative to each other.

* * * * *